(12) United States Patent
Shimizu et al.

(10) Patent No.: US 7,589,578 B2
(45) Date of Patent: Sep. 15, 2009

(54) LEVEL SHIFT CIRCUIT AND SEMICONDUCTOR DEVICE

(75) Inventors: Yoshiaki Shimizu, Kasugai (JP); Hisao Suzuki, Kasugai (JP)

(73) Assignee: Fujitsu Microelectronics Limited, Tokyo (JP)

( * ) Notice: Subject to any disclaimer, the term of this patent is extended or adjusted under 35 U.S.C. 154(b) by 0 days.

(21) Appl. No.: 11/337,481

(22) Filed: Jan. 24, 2006

(65) Prior Publication Data

US 2007/0046357 A1 Mar. 1, 2007

(30) Foreign Application Priority Data

Aug. 25, 2005 (JP) ............... 2005-244562

(51) Int. Cl.
 *H03L 5/00* (2006.01)
(52) U.S. Cl. ..................... 327/333; 327/540
(58) Field of Classification Search ................ 327/333, 327/548, 540, 541, 543; 323/316
See application file for complete search history.

(56) References Cited

U.S. PATENT DOCUMENTS

| 6,040,708 | A |   | 3/2000 | Blake et al. | |
|---|---|---|---|---|---|
| 6,049,237 | A | * | 4/2000 | Nakao | ........................ 327/103 |
| 6,445,622 | B1 |   | 9/2002 | Hirano | |
| 6,614,283 | B1 |   | 9/2003 | Wright et al. | |
| 6,686,779 | B2 | * | 2/2004 | Yoshikawa | ................... 327/108 |
| 6,791,391 | B2 |   | 9/2004 | Nishimura et al. | |
| 2002/0047740 | A1 | * | 4/2002 | Suzuki et al. | ............... 327/333 |
| 2002/0088995 | A1 |   | 7/2002 | De Santis | |

FOREIGN PATENT DOCUMENTS

| JP | 63-318817 A | 12/1988 |
|---|---|---|
| JP | 09-172368 A | 6/1997 |
| JP | 2000-040366 A | 2/2000 |
| JP | 2000-295089 A | 10/2000 |
| JP | 2002-190731 A | 7/2002 |
| JP | 2005-101747 A | 4/2005 |

\* cited by examiner

*Primary Examiner*—Lincoln Donovan
*Assistant Examiner*—Diana J Cheng
(74) *Attorney, Agent, or Firm*—Arent Fox LLP

(57) ABSTRACT

A level shift circuit for sustaining the activation and inactivation response of a transistor with respect to an input signal in a preferable manner. The level shift circuit includes a shift circuit for converting an input signal having a first voltage to an output signal having a second voltage that is higher than the first voltage. The voltage generation circuit includes a control voltage generation circuit, for generating control voltage having a generally constant voltage level irrespective of the level of a power supply voltage, and a bias generation circuit. The bias generation circuit generates bias voltage so that the node voltage of the shift circuit is substantially equalized with the control voltage.

12 Claims, 3 Drawing Sheets

LEVEL SHIFT CIRCUIT AND SEMICONDUCTOR DEVICE

CROSS-REFERENCE TO RELATED APPLICATIONS

This application is based upon and claims the benefit of priority from the prior Japanese Patent Application No. 2005-244562, filed on Aug. 25, 2005, the entire contents of which are incorporated herein by reference.

BACKGROUND OF THE INVENTION

The present invention relates to a semiconductor device, and more particularly, to a level shift circuit for converting an input signal having a first voltage level to an output signal having a second voltage level that is higher than the first voltage level.

Recent semiconductor devices (LSIs) are required to have an increased number of functions. This has lowered the power supply voltage and increased the number of power supplies in an LSI. In such an LSI, a level shift circuit is used as an interface circuit for connecting circuits having different power supply voltages.

FIG. 1 is a schematic circuit diagram of a level shift circuit described in Japanese Laid-Open Patent Publication No. 2002-190731. A level shift circuit 21 converts an input signal IN to an output signal OUT. The input signal IN shifts between a power supply voltage VD1 and ground voltage GND. The output signal OUT shifts between a power supply voltage VD2, which is higher than the power supply voltage VD1, and the ground voltage GND. The level shift circuit 21 includes an input circuit 22, a shift circuit 23, and a voltage generation circuit 24.

The input circuit 22 is an inverter circuit including a low breakdown voltage P-channel MOS transistor (PMOS transistor) Tr31 and a low breakdown voltage N-channel MOS transistor (NMOS transistor) Tr32. The input circuit 22 inverts the input signal IN to generate an inverted input signal /IN ('/' represents inversion).

The shift circuit 23 includes high breakdown voltage PMOS transistors Tr41 and Tr42, high breakdown voltage NMOS transistors Tr43 and Tr44, and low breakdown NMOS transistors Tr45 and Tr46. The gates of the NMOS transistors Tr43 and Tr44 in the shift circuit 23 are supplied with bias voltage VB from the voltage generation circuit 24. The gates of the NMOS transistors Tr45 and Tr46 are respectively supplied with the inverted input signal /IN and the input signal IN. The NMOS transistors Tr45 and Tr46 are activated and inactivated in a complementary manner in response to the inverted input signal /IN and the input signal IN. The output signal OUT is generated at a node between the drain of the PMOS transistor Tr41 and the drain of the NMOS transistor Tr43.

The voltage generation circuit 24 includes high breakdown voltage PMOS transistors Tr51, Tr52, Tr53, Tr54, Tr55, and Tr56 and high breakdown voltage NMOS transistors Tr57 and Tr58. The PMOS transistor Tr51 and the NMOS transistor Tr57 are both activated in response to a control signal CNTL having a high level. This generates a bias voltage VB of approximately ½×VD2 at a node between the drain of the PMOS transistor Tr53 and the source of the PMOS transistor Tr54.

In the level shift circuit 21, low breakdown voltage devices are used as the NMOS transistors Tr45 and Tr46 of the shift circuit 23. This ensures the activation and inactivation response of the transistors Tr45 and Tr46 with respect to the input signal IN. Further, high breakdown voltage devices are used as the NMOS transistors Tr43 and Tr44 of the shift circuit 23, and the bias voltage VB generated by the voltage generation circuit 24 is applied to the gates of the NMOS transistors Tr43 and Tr44. This prevents a voltage that exceeds the source-drain breakdown voltage of the low breakdown voltage NMOS transistors Tr45 and Tr46 from being applied to the drains of the transistors Tr45 and Tr46 (nodes Na and Nb).

SUMMARY OF THE INVENTION

In the level shift circuit 21, the bias voltage VB generated by the voltage generation circuit 24 is dependent on the voltage level of the power supply voltage VD2. Thus, a decrease in the power supply voltage VD2 would decrease bias voltage VB. A decrease in the bias voltage VB reduces the current flowing to the sources of the NMOS transistors Tr43 and Tr44 and the current flowing to the drains of the NMOS transistors Tr45 and Tr46. Referring to FIG. 4, when the voltage applied to the drains of the NMOS transistors Tr45 and Tr46 (node voltages Vna and Vnb in FIG. 4) is lower than a predetermined specified voltage, the operation speed of the NMOS transistors fall. As a result, the transistors Tr45 and Tr46 cannot be used at full capacity (in FIG. 4, when the power supply voltage VD2 decreases to voltage VD2', the node voltages Vna and Vnb become lower than the specified voltage Vr). This lowers the activation and inactivation response of the NMOS transistors Tr45 and Tr46 with respect to the input signal IN.

The present invention provides a level shift circuit for sustaining the activation and inactivation response of the transistors with respect to an input signal in a preferable manner.

One aspect of the present invention is a level shift circuit including a shift circuit for converting an input signal, which shifts between a reference voltage and a first voltage, to an output signal, which shifts between the reference voltage and a second voltage that is higher than the first voltage. The shift circuit includes a first N-channel MOS transistor having a drain, a source supplied with the reference voltage, and a gate for receiving the input signal. A second N-channel MOS transistor has a drain, a source supplied with the reference voltage, and a gate for receiving an inverted input signal, which is an inverted version of the input signal. A third N-channel MOS transistor has a drain, a source connected to the drain of the first N-channel MOS transistor, and a gate for receiving a bias voltage. A first node is defined between the source of the third N-channel MOS resistor and the drain of the first N-channel MOS transistor. A fourth N-channel MOS transistor has a drain, a source connected to the drain of the second N-channel MOS transistor, and a gate for receiving the bias voltage. A second node is defined between the source of the fourth N-channel MOS resistor and the drain of the second N-channel MOS transistor. A first P-channel MOS transistor has a gate, a source for receiving the second voltage, and a drain connected to the drain of the third N-channel MOS transistor. A second P-channel MOS transistor has a gate, a source for receiving the second voltage, and a drain connected to the drain of the fourth N-channel MOS transistor. The gate of the first P-channel MOS transistor is connected to the drain of the second P-channel MOS transistor, and the gate of the second P-channel MOS transistor is connected to the drain of the first P-channel MOS transistor. A voltage generation circuit generates the bias voltage supplied to the shift circuit. The voltage generation circuit includes a control voltage generation circuit for generating a control voltage having a generally constant level irrespective of the level of the second voltage. A bias generation circuit, connected to the control voltage generation circuit, generates the bias voltage so that the voltage at the first node and the voltage at the second node are substantially equalized with the control voltage.

Another aspect of the present invention is a semiconductor device provided with a level shift circuit including a shift circuit for converting an input signal, which shifts between a reference voltage and a first voltage, to an output signal, which shifts between the reference voltage and a second voltage that is higher than the first voltage. The shift circuit includes a first N-channel MOS transistor having a drain, a source supplied with the reference voltage, and a gate for receiving the input signal. A second N-channel MOS transistor has a drain, a source supplied with the reference voltage, and a gate for receiving an inverted input signal, which is an inverted version of the input signal. A third N-channel MOS transistor has a drain, a source connected to the drain of the first N-channel MOS transistor, and a gate for receiving a bias voltage. A first node is defined between the source of the third N-channel MOS resistor and the drain of the first N-channel MOS transistor. A fourth N-channel MOS transistor has a drain, a source connected to the drain of the second N-channel MOS transistor, and a gate for receiving the bias voltage. A second node is defined between the source of the fourth N-channel MOS resistor and the drain of the second N-channel MOS transistor. A first P-channel MOS transistor has a gate, a source for receiving the second voltage, and a drain connected to the drain of the third N-channel MOS transistor. A second P-channel MOS transistor has a gate, a source for receiving the second voltage, and a drain connected to the drain of the fourth N-channel MOS transistor. The gate of the first P-channel MOS transistor is connected to the drain of the second P-channel MOS transistor, and the gate of the second P-channel MOS transistor is connected to the drain of the first P-channel MOS transistor. A voltage generation circuit generates the bias voltage supplied to the shift circuit. The voltage generation circuit includes a control voltage generation circuit for generating a control voltage having a generally constant level irrespective of the level of the second voltage. A bias generation circuit, connected to the control voltage generation circuit, generates the bias voltage so that the voltage at the first node and the voltage at the second node are substantially equalized with the control voltage.

Other aspects and advantages of the present invention will become apparent from the following description, taken in conjunction with the accompanying drawings, illustrating by way of example the principles of the invention.

BRIEF DESCRIPTION OF THE DRAWINGS

The invention, together with objects and advantages thereof, may best be understood by reference to the following description of the presently preferred embodiments together with the accompanying drawings in which.

DETAILED DESCRIPTION OF THE PREFERRED EMBODIMENTS

A level shift circuit 1 according to a preferred embodiment of the present invention will now be described with reference to FIGS. 2 and 3. The level shift circuit 1 is incorporated in a semiconductor device (not shown).

The level shift circuit 1 converts an input signal IN to an output signal OUT. The input signal IN shifts between a power supply voltage VD1 (first voltage) and ground voltage GND (reference voltage). The output signal OUT shifts between a power supply voltage VD2 (second voltage), which is higher than the power supply voltage VD1, and the ground voltage GND.

Figure 2:
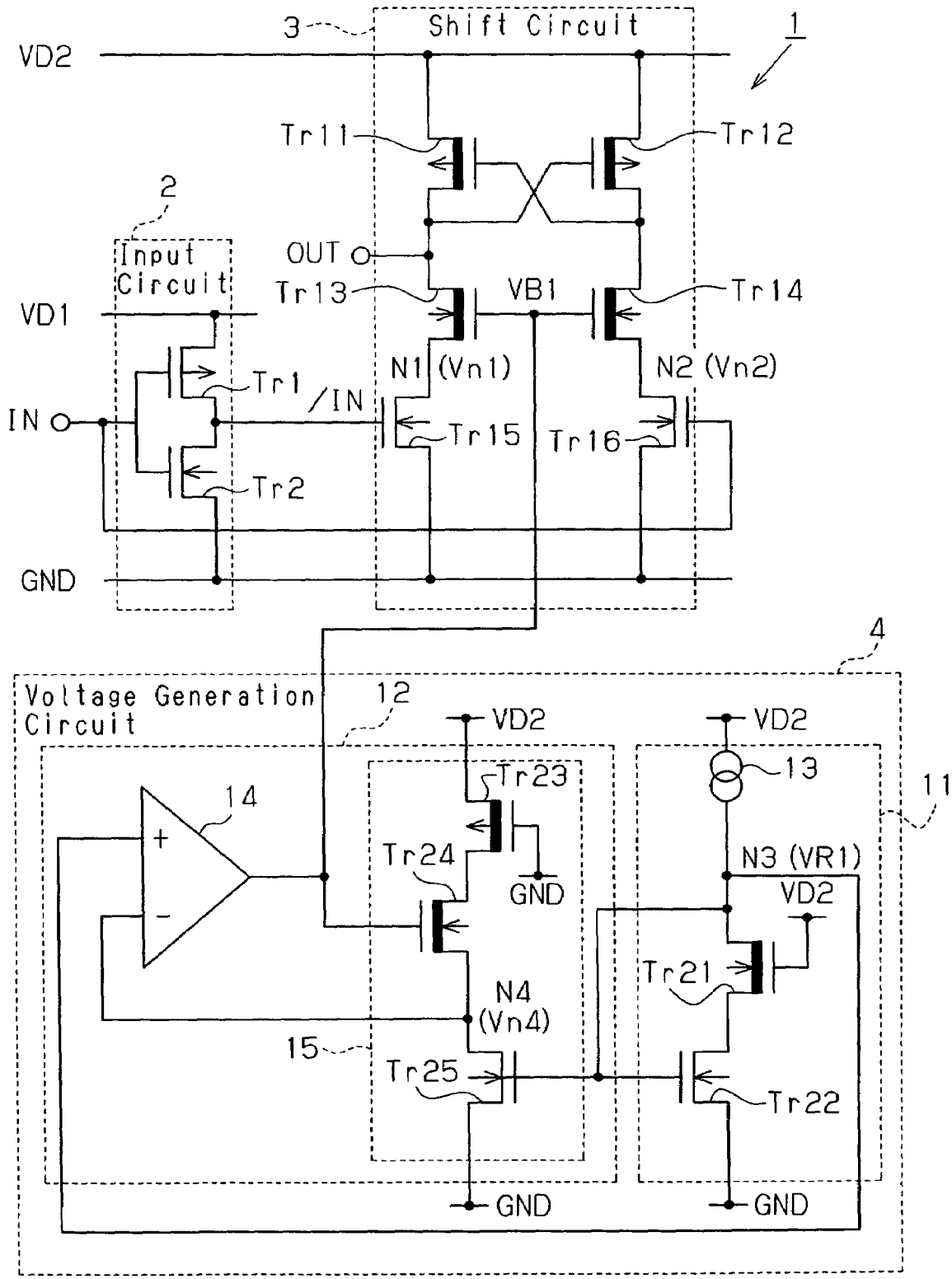
FIG. 2 is a schematic circuit diagram of a level shift circuit according to a preferred embodiment of the present invention.

Referring to FIG. 2, the level shift circuit 1 includes an input circuit 2, a shift circuit 3, and a voltage generation circuit 4.

The input circuit 2 is an inverter circuit including a low breakdown voltage P-channel MOS transistor (PMOS transistor) Tr1 and a low breakdown voltage N-channel MOS transistor (NMOS transistor) Tr2. A low breakdown voltage transistor is a transistor (low breakdown voltage device) having a relatively low source-drain breakdown voltage.

The power supply voltage VD1 is applied to the source of the PMOS transistor Tr1. The drain of the PMOS transistor Tr1 is connected to the drain of the NMOS transistor Tr2. Ground voltage GND is applied to the source of the NMOS transistor Tr2. The gates of the PMOS transistor Tr1 and the NMOS transistor Tr2 are provided with the input signal IN. An inverted input signal /IN ('/' represents inversion), which is the inverted version of the input signal IN, is generated at a node between the drain of the PMOS transistor Tr1 and the drain of the NMOS transistor Tr2.

The shift circuit 3, which is activated by the bias voltage VB1, converts the input signal IN, which has a low voltage level, to the output signal OUT, which has a high voltage level. The shift circuit 3 includes high breakdown voltage PMOS transistors Tr11 and Tr12, high breakdown voltage NMOS transistors Tr13 and Tr14, and low breakdown voltage NMOS transistors Tr15 and Tr16. A high breakdown voltage transistor refers to a transistor (high breakdown voltage device) having a source-drain breakdown voltage that is higher than the source-drain breakdown voltage of the above low breakdown voltage transistors.

The power supply voltage VD2 is commonly applied to the sources of the PMOS transistors Tr11 and Tr12. The gate of the PMOS transistor Tr11 is connected to the drain of the PMOS transistor Tr12. The gate of the PMOS transistor Tr12 is connected to the drain of the PMOS transistor Tr11. The drains of the PMOS transistors Tr11 and Tr12 are respectively connected to the drains of the NMOS transistors Tr13 and Tr14. The voltage generation circuit 4 commonly applies the bias voltage VB1 to the gates of the NMOS transistors Tr13 and Tr14. The sources of the NMOS transistors Tr13 and Tr14 are respectively connected to the drains of the NMOS transistors Tr15 and Tr16. The ground voltage GND is commonly applied to the sources of the NMOS transistors Tr15 and Tr16. The gates of the NMOS transistors Tr15 and Tr16 are respectively provided with the inverted input signal /IN and the input signal IN.

In the shift circuit 3, the bias voltage VB1 from the voltage generation circuit 4 activates the NMOS transistors Tr13 and Tr14. Further, the NMOS transistors Tr15 and Tr16 are activated and inactivated in a complementary manner based on the input signal IN and the inverted input signal /IN. This generates the output signal OUT at a node between the drain of the PMOS transistor Tr11 and the drain of the NMOS transistor Tr13.

The voltage generation circuit 4 includes a control voltage generation circuit 11 and a bias generation circuit 12.

The control voltage generation circuit 11 generates control voltage VR1 for controlling voltage at node N1 (node voltage Vn1) and voltage at node N2 (node voltage Vn2). Node N1 is located between the source of the NMOS transistor Tr13 and the drain of the NMOS transistor Tr15. Node N2 is located between the source of the NMOS transistor Tr14 and the drain of the NMOS transistor Tr16. The control voltage VR1 is set so that it has a value that does not exceed the source-drain breakdown voltage of the NMOS transistors Tr15 and Tr16, while enabling the NMOS transistors Tr15 and Tr16 to be used at full capacity.

The control voltage generation circuit 11 includes a current source 13, a high breakdown voltage NMOS transistor Tr21, and a low breakdown voltage NMOS transistor Tr22. The NMOS transistor Tr22 has the same characteristic (current drive capability) as the NMOS transistors Tr15 and Tr16 of the shift circuit 3.

The current source 13 is supplied with the power supply voltage VD2 and connected to the drain of the NMOS transistor Tr21. The NMOS transistor Tr21, which includes a source connected to the drain of the NMOS transistor Tr22 and a gate for receiving the power supply voltage VD2, is controlled to be constantly activated. The NMOS transistor Tr22 includes a source for receiving the ground voltage GND and a gate connected to the drain of the NMOS transistor Tr21. That is, the NMOS transistor Tr22 is diode-connected to the current source 13 via the NMOS transistor Tr21. The drain voltage of the NMOS transistor Tr21 is higher than the drain voltage of the NMOS transistor Tr22 by an amount corresponding to the threshold voltage Vth of an NMOS transistor Tr24, which will be described later.

The control voltage generation circuit 11 generates the control voltage VR1 at a node N3 between the current source 13 and the drain of the NMOS transistor Tr21. The control current VR1 has a generally constant voltage level and is based on the constant current value of the current source 13 and the ON resistance of the NMOS transistors Tr21 and Tr22.

The bias generation circuit 12 includes an operational amplifier 14, a high breakdown voltage PMOS transistor Tr23, a high breakdown voltage NMOS transistor Tr24, and a low breakdown voltage NMOS transistor Tr25. The PMOS transistor Tr23 has the same characteristics as the PMOS transistors Tr11 and Tr12 of the shift circuit 3. The NMOS transistor Tr24 has the same characteristics as the NMOS transistors Tr13 and Tr14 of the shift circuit 3. The NMOS transistor Tr25 has the same characteristics as the NMOS transistors Tr15 and Tr16 of the shift circuit 3. In this embodiment, the PMOS transistors Tr23 and the NMOS transistors Tr24 and Tr25 form a node voltage output circuit 15.

The PMOS transistor Tr23 includes a source for receiving the power supply voltage VD2, a drain connected to the drain of the NMOS transistor Tr24, and a gate for receiving the ground voltage GND. The PMOS transistor Tr23 is constantly activated. The PMOS transistor Tr23 generates a simulated activation state of the PMOS transistor Tr11 (Tr12) in the shift circuit 3.

The NMOS transistor Tr24 includes a source connected to the drain of the NMOS transistor Tr25 and a gate connected to the gates of the NMOS transistors Tr13 and Tr14 in the shift circuit 3 and to the output terminal of the operational amplifier 14.

The NMOS transistor Tr25 includes a source for receiving the ground voltage GND and a gate connected to the gate of the NMOS transistor Tr22 and the drain of the NMOS transistor Tr21 in the control voltage generation circuit 11. The NMOS transistor Tr25 and the NMOS transistor Tr22 of the control voltage generation circuit 11 form a current mirror circuit.

The operational amplifier 14 is a differential amplifier including a non-inverting input terminal (+) for receiving the control voltage VR1 and an inverting input terminal (−) for receiving the output signal of the operational amplifier 14 that is fed back via the NMOS transistor Tr24. More specifically, the inverting input terminal of the operational amplifier 14 is supplied with the voltage at node N4 (node voltage Vn4) between the source of the NMOS transistor Tr24 and the drain of the NMOS transistor Tr25. The operational amplifier 14 amplifies the voltage difference between the control voltage VR1 and the node voltage Vn4 to generate the bias voltage VB1 and supply the bias voltage VB1 to the gate of the NMOS transistor Tr24 and the gates of the NMOS transistors Tr13 and Tr14 in the shift circuit 3.

In this embodiment, an offset, which corresponds to the threshold voltage Vth of the NMOS transistor Tr24, is set for the operational amplifier 14 based on the source-drain voltage of the NMOS transistor Tr21. The offset stabilizes the operation of the negative feedback loop.

The voltage generation circuit 4 generates the control voltage VR1 for controlling the node voltages Vn1 and Vn2 irrespective of the level of the power supply voltage VD2 (without being dependent on the level of the power supply voltage VD2). Further, the voltage generation circuit 4 generates the bias voltage VB1 with the negative feedback loop so that the node voltage Vn4 is substantially equalized with the control voltage Vr1. This controls and substantially equalizes the node voltages Vn1 and Vn2 with the node voltage Vn4, or the control voltage VR1.

The operation of the level shift circuit 1 will now be discussed.

Figure 3:
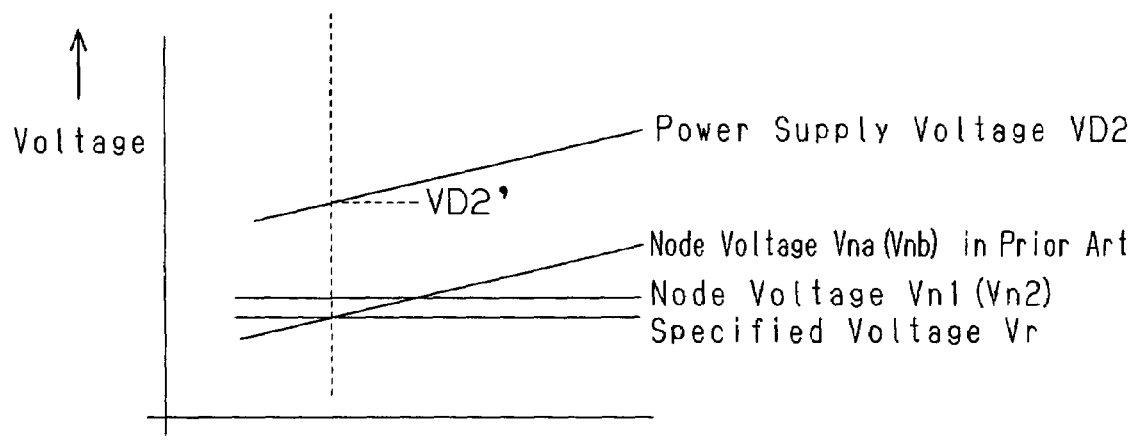
FIG. 3 is a graph showing the characteristics of the level shift circuit of FIG. 2.
Figure 4:
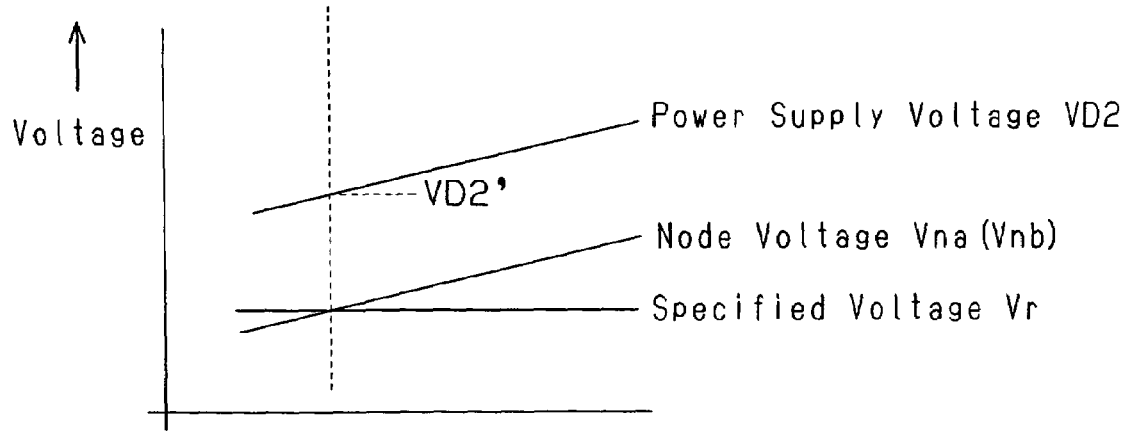
FIG. 4 is a graph showing the characteristics of the level shift circuit of FIG. 1.

FIG. 3 is a graph showing the characteristics of the level shift circuit 1 in this embodiment. In the graph, the specified voltage Vr corresponds to the level of the drain voltage that is required to sustain the capabilities (operation speed) of the transistors Tr13 and Tr14.

Figure 1:
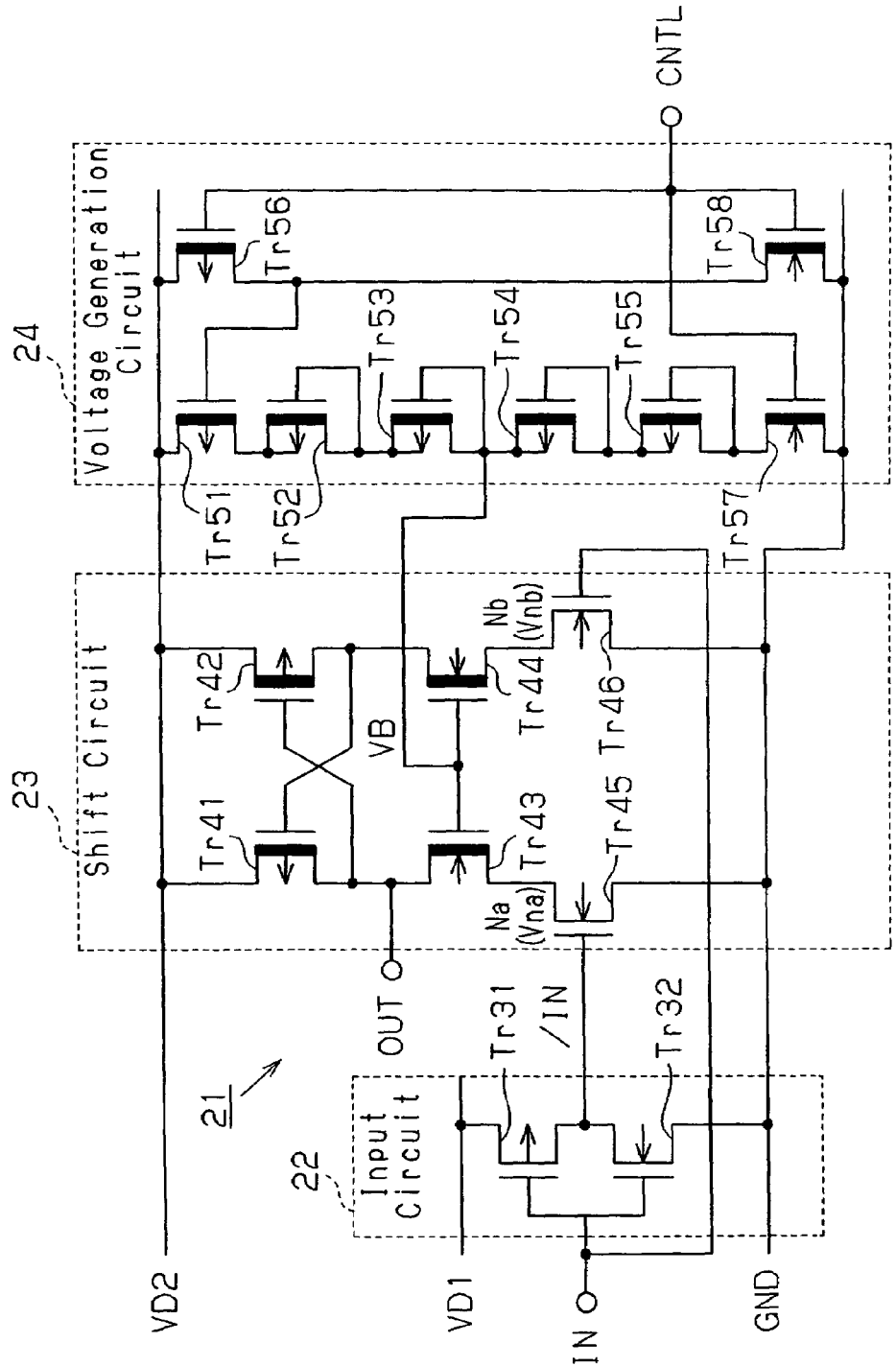
FIG. 1 is a schematic circuit diagram of a prior art level shift circuit.

As shown in FIG. 3, in this embodiment, the generated bias voltage VB1 has a generally constant voltage level irrespective of the power supply voltage VD2. Accordingly, even if the power supply voltage VD2 decreases, the node voltage Vn1 (Vn2) is sustained at a generally constant voltage level (i.e., the voltage level of the control voltage VR1). In the level shift circuit 21 of the prior art shown in FIG. 1, when the power supply voltage VD2 becomes lower than the voltage VD2', the node voltage Vna (Vnb) becomes lower than the specified voltage Vr and decreases the operation speed of the transistors Tr45 and Tr46. However, in this embodiment, the node voltage Vn1 (Vn2) is sustained at a generally constant voltage level as long as the power supply voltage VD2 is higher than or equal to control voltage VR1. By sustaining the level of the node voltage Vn1, the activation and inactivation response of the NMOS transistors Tr13 and Tr14 with respect to the input signal IN is sustained in an optimal manner.

The level shift circuit 1 of this embodiment has the advantages described below.

(1) The level shift circuit 1 includes the control voltage generation circuit 11 and the bias generation circuit 12. The control voltage generation circuit 11 generates the control voltage VR1 for controlling the node voltages Vn1 and Vn2 irrespective of the power supple voltage VD2 at a generally constant level. The bias generation circuit 12 generates the bias voltage VB1 so that the node voltages Vn1 and Vn2 are substantially equalized with the control voltage VR1. Thus, the bias voltage VB supplied to the shift circuit 3 is stabilized even if the power supply voltage VD2 fluctuates. This sustains the activation and inactivation response of the NMOS transistors Tr15 and Tr16 with respect to the input signal IN in an optimal manner.

(2) The bias generation circuit 12 includes the node voltage output circuit 15 (transistors Tr23, Tr24, and Tr25) for simulating the node voltages Vn1 and Vn2 (i.e., for generating node voltage that is substantially equal to the node voltages Vn1 and Vn2). Further, the bias generation circuit 12 includes the operational amplifier 14 for detecting the node voltage Vn4, which is the output voltage of the node voltage output circuit 15, and generating the bias voltage VB1, which corresponds to the voltage difference between the node voltage Vn4 and the control voltage VR1. Such a negative feedback loop further stably generates the bias voltage VB1.

(3) The control voltage generation circuit 11 and the transistors of the node voltage output circuit 15 have the same characteristics as the transistors of the shift circuit 3. This optimizes the bias voltage VB1.

It should be apparent to those skilled in the art that the present invention may be embodied in many other specific forms without departing from the spirit or scope of the invention. Particularly, it should be understood that the present invention may be embodied in the following forms.

The power supply connected to the current source 13 of the control voltage generation circuit 11 is not limited to a power supply that supplies the power supply voltage VD2.

The NMOS transistor Tr21 of the control voltage generation circuit 11 may be a resistor.

The transistors of the voltage generation circuit 4 do not have to have the same characteristics as the transistors of the shift circuit 3.

The configuration of the voltage generation circuit 4 is not limited to the configuration described above and may be modified within the technical scope of the present invention.

The present examples and embodiments are to be considered as illustrative and not restrictive, and the invention is not to be limited to the details given herein, but may be modified within the scope and equivalence of the appended claims.

What is claimed is:

1. A level shift circuit comprising:
    a shift circuit for converting an input signal, which shifts between a reference voltage and a first voltage, to an output signal, which shifts between the reference voltage and a second voltage that is higher than the first voltage, the shift circuit including;
    a first N-channel MOS transistor having a drain, a source supplied with the reference voltage, and a gate for receiving the input signal;
    a second N-channel MOS transistor having a drain, a source supplied with the reference voltage, and a gate for receiving an inverted input signal, which is an inverted version of the input signal;
    a third N-channel MOS transistor having a drain, a source connected to the drain of the first N-channel MOS transistor, and a gate for receiving a bias voltage, wherein a first node is defined between the source of the third N-channel MOS resistor and the drain of the first N-channel MOS transistor;
    a fourth N-channel MOS transistor having a drain, a source connected to the drain of the second N-channel MOS transistor, and a gate for receiving the bias voltage, wherein a second node is defined between the source of the fourth N-channel MOS transistor and the drain of the second N-channel MOS transistor; and
    a voltage generation circuit for generating the bias voltage supplied to the shift circuit, the voltage generation circuit including;
        a control voltage generation circuit for generating a control voltage having a generally constant level irrespective of the level of the second voltage; and
        a bias generation circuit, connected to the control voltage generation circuit, for generating the bias voltage based on the comparison between a third voltage that is substantially equal to the voltages at the first and second nodes and the control voltage,
    wherein the control voltage generation circuit includes:
        a current source for generating a constant current;
        a fifth N-channel MOS transistor that is diode-connected to the current source, the control voltage being generated at a node between the current source and the fifth N-channel MOS transistor; and
        a sixth N-channel MOS transistor that is constantly activated and connected between the current source and the fifth N-channel MOS transistor,
    wherein the bias generation circuit includes:
        a seventh N-channel MOS transistor having a characteristic that is the same as that of the first N-channel MOS transistor and the second N-channel MOS transistor, the seventh N-channel MOS transistor having a drain, a source for receiving the reference voltage, and a gate for receiving the control voltage; and
        an eighth N-channel MOS transistor having a characteristic that is the same as that of the third N-channel MOS transistor and the fourth N-channel MOS transistor, the eighth N-channel MOS transistor having a drain, a source connected to the drain of the seventh N-channel MOS transistor, and a gate for receiving the bias voltage, an output voltage being generated at a node between the drain of the seventh N-channel MOS transistor and the source of the eighth N-channel MOS transistor, and
    wherein the first, second, fifth, and seventh N-channel MOS transistors are low breakdown voltage N-channel MOS transistors, and third, fourth, sixth, and eighth N-channel MOS transistors are high breakdown voltage N-channel MOS transistors.

2. The level shift circuit according to claim 1, wherein the fifth N-channel MOS transistor has a characteristic that is the same as that of the first N-channel MOS transistor and the second N-channel MOS transistor.

3. The level shift circuit according to claim 1, wherein the bias generation circuit includes
    an operational amplifier, connected to the output voltage and the control voltage generation circuit, for generating the bias voltage in accordance with the voltage difference between the output voltage of the node voltage output circuit and the control voltage.

4. The level shift circuit according to claim 1, wherein the shift circuit includes:
    a first P-channel MOS transistor having a gate, a source for receiving the second voltage, and a drain connected to the drain of the third N-channel MOS transistor, and
    a second P-channel MOS transistor having a gate, a source for receiving the second voltage, and a drain connected to the drain of the fourth N-channel MOS transistor,
    wherein the gate of the first P-channel MOS transistor is connected to the drain of the second P-channel MOS transistor, and the gate of the second P-channel MOS transistor is connected to the drain of the first P-channel MOS transistor.

5. The level shift circuit according to claim 4, wherein the bias generation circuit includes:
    a third P-channel MOS transistor having a characteristic that is the same as that of the first P-channel MOS transistor and the second P-channel MOS transistor, the third P-channel MOS transistor having a drain connected to the source of the eighth N-channel MOS transistor, a source for receiving the second voltage, and a gate for receiving the reference voltage.

6. The level shift circuit according to claim 5, wherein the operational amplifier includes an offset that is set in accordance with a threshold voltage of the eighth N-channel MOS transistor.

7. A semiconductor device comprising:
a level shift circuit including:
a shift circuit for converting an input signal, which shifts between a reference voltage and a first voltage, to an output signal, which shifts between the reference voltage and a second voltage that is higher than the first voltage, the shift circuit including;
a first N-channel MOS transistor having a drain, a source supplied with the reference voltage, and a gate for receiving the input signal;
a second N-channel MOS transistor having a drain, a source supplied with the reference voltage, and a gate for receiving an inverted input signal, which is an inverted version of the input signal;
a third N-channel MOS transistor having a drain, a source connected to the drain of the first N-channel MOS transistor, and a gate for receiving a bias voltage, wherein a first node is defined between the source of the third N-channel MOS resistor and the drain of the first N-channel MOS transistor;
a fourth N-channel MOS transistor having a drain, a source connected to the drain of the second N-channel MOS transistor, and a gate for receiving the bias voltage, wherein a second node is defined between the source of the fourth N-channel MOS transistor and the drain of the second N-channel MOS transistor;
a first P-channel MOS transistor having a gate, a source for receiving the second voltage, and a drain connected to the drain of the third N-channel MOS transistor; and
a second P-channel MOS transistor having a gate, a source for receiving the second voltage, and a drain connected to the drain of the fourth N-channel MOS transistor, the gate of the first P-channel MOS transistor being connected to the drain of the second P-channel MOS transistor, and the gate of the second P-channel MOS transistor being connected to the drain of the first P-channel MOS transistor; and
a voltage generation circuit for generating the bias voltage supplied to the shift circuit, the voltage generation circuit including:
a control voltage generation circuit for generating a control voltage having a generally constant level irrespective of the level of the second voltage; and
a bias generation circuit, connected to the control voltage generation circuit, for generating the bias voltage based on the comparison between a third voltage that is substantially equal to the voltages at the first and second nodes and the control voltage,
wherein the control voltage generation circuit includes:
a current source for generating a constant current;
a fifth N-channel MOS transistor that is diode-connected to the current source, the control voltage being generated at a node between the current source and the fifth N-channel MOS transistor; and
a sixth N-channel MOS transistor that is constantly activated and connected between the current source and the fifth N-channel MOS transistor,
wherein the bias generation circuit includes:
a seventh N-channel MOS transistor having a characteristic that is the same as that of the first N-channel MOS transistor and the second N-channel MOS transistor, the seventh N-channel MOS transistor having a drain, a source for receiving the reference voltage, and a gate for receiving the control voltage; and
an eighth N-channel MOS transistor having a characteristic that is the same as that of the third N-channel MOS transistor and the fourth N-channel MOS transistor, the eighth N-channel MOS transistor having a drain, a source connected to the drain of the seventh N-channel MOS transistor, and a gate for receiving the bias voltage, an output voltage being generated at a node between the drain of the seventh N-channel MOS transistor and the source of the eighth N-channel MOS transistor, and
wherein the first, second, fifth, and seventh N-channel MOS transistors are low breakdown voltage N-channel MOS transistors, and third, fourth, sixth, and eighth N-channel MOS transistors are high breakdown voltage N-channel MOS transistors.

8. The semiconductor device according to claim 7, wherein the fifth N-channel MOS transistor has a characteristic that is the same as that of the first N-channel MOS transistor and the second N-channel MOS transistor.

9. The semiconductor device according to claim 7, wherein the bias generation circuit includes
an operational amplifier, connected to the output voltage and the control voltage generation circuit, for generating the bias voltage in accordance with the voltage difference between the output voltage of the node voltage output circuit and the control voltage.

10. The semiconductor device according to claim 7, wherein the shift circuit includes:
a first P-channel MOS transistor having a gate, a source for receiving the second voltage, and a drain connected to the drain of the third N-channel MOS transistor, and
a second P-channel MOS transistor having a gate, a source for receiving the second voltage, and a drain connected to the drain of the fourth N-channel MOS transistor,
wherein the gate of the first P-channel MOS transistor is connected to the drain of the second P-channel MOS transistor, and the gate of the second P-channel MOS transistor is connected to the drain of the first P-channel MOS transistor.

11. The semiconductor device according to claim 10, wherein the bias generation circuit includes
a third P-channel MOS transistor having a characteristic that is the same as that of the first P-channel MOS transistor and the second P-channel MOS transistor, the third P-channel MOS transistor having a drain connected to the source of the eighth N-channel MOS transistor, a source for receiving the second voltage, and a gate for receiving the reference voltage.

12. The semiconductor device according to claim 11, wherein the operational amplifier includes an offset that is set in accordance with a threshold voltage of the eighth N-channel MOS transistor.

* * * * *